(12) United States Patent
Lu et al.

(10) Patent No.: US 10,068,995 B2
(45) Date of Patent: Sep. 4, 2018

(54) SEMICONDUCTOR DEVICE INCLUDING FIELD EFFECT TRANSISTOR AND A METHOD FOR FABRICATING THE SAME

(71) Applicants: TAIWAN SEMICONDUCTOR MANUFACTURING CO., LTD., Hsinchu (TW); National Taiwan University, Taipei (TW)

(72) Inventors: Fang-Liang Lu, New Taipei (TW); CheeWee Liu, Taipei (TW); Chi-Wen Liu, Hsinchu (TW); Shih-Hsien Huang, Yilan County (TW); I-Hsieh Wong, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/210,388

(22) Filed: Jul. 14, 2016

(65) Prior Publication Data
US 2018/0019326 A1    Jan. 18, 2018

(51) Int. Cl.
| | |
|---|---|
| *H01L 29/76* | (2006.01) |
| *H01L 29/66* | (2006.01) |
| *H01L 21/268* | (2006.01) |
| *H01L 21/324* | (2006.01) |
| *H01L 29/06* | (2006.01) |
| *H01L 29/08* | (2006.01) |
| *H01L 29/10* | (2006.01) |
| *H01L 29/16* | (2006.01) |
| *H01L 29/161* | (2006.01) |
| *H01L 29/167* | (2006.01) |
| *H01L 29/78* | (2006.01) |

(52) U.S. Cl.
CPC ...... *H01L 29/66803* (2013.01); *H01L 21/268* (2013.01); *H01L 21/324* (2013.01); *H01L 29/0653* (2013.01); *H01L 29/0847* (2013.01); *H01L 29/1037* (2013.01); *H01L 29/1054* (2013.01); *H01L 29/16* (2013.01); *H01L 29/161* (2013.01); *H01L 29/167* (2013.01); *H01L 29/7851* (2013.01)

(58) Field of Classification Search
CPC ............. H01L 29/0653; H01L 29/0847; H01L 29/66803; H01L 21/324; H01L 21/268
USPC ......................................... 257/401
See application file for complete search history.

(56) References Cited

U.S. PATENT DOCUMENTS

2013/0071980 A1*  3/2013  Lin ................. H01L 29/045
                                                    438/300
2015/0187571 A1*  7/2015  Fan ................ H01L 29/0653
                                                    257/401

OTHER PUBLICATIONS

Chi on Chui et al., "Activation and diffusion studies of ion-implanted p and n dopants in germanium", Applied Physics Letters, vol. 83, No. 16, Oct. 20, 2003, pp. 3275-3277.

(Continued)

*Primary Examiner* — Theresa T Doan
(74) *Attorney, Agent, or Firm* — McDermott Will & Emery LLP

(57) ABSTRACT

In a method of fabricating a field effect transistor, a fin structure made of a first semiconductor material is formed so that the fin structure protrudes from an isolation insulating layer disposed over a substrate. A gate structure is formed over a part of the fin structure, thereby defining a channel region, a source region and a drain region in the fin structure. After the gate structure is formed, laser annealing is performed on the fin structure.

20 Claims, 7 Drawing Sheets

(56) References Cited

OTHER PUBLICATIONS

D.B. Cuttriss, "Relation Between Surface Concentration and Average Conductivity in Diffused Layers in Germanium", The Bell System Technical Journal, Mar. 1961, pp. 509-521.

* cited by examiner

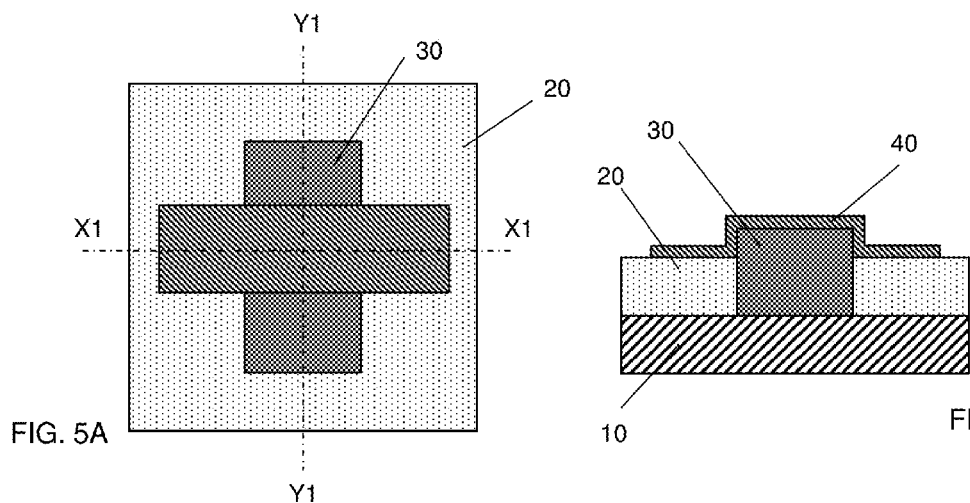
FIG. 5A
FIG. 5B
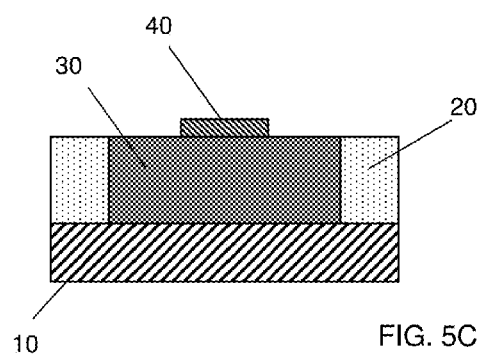
FIG. 5C
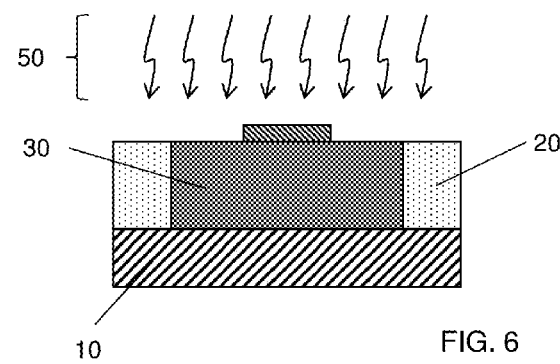
FIG. 6

US 10,068,995 B2

SEMICONDUCTOR DEVICE INCLUDING FIELD EFFECT TRANSISTOR AND A METHOD FOR FABRICATING THE SAME

TECHNICAL FIELD

The disclosure relates to semiconductor devices including field effect transistors (FETs) and methods for manufacturing the same, and more particularly to FETs using n-type Ge or SiGe and methods using laser annealing.

BACKGROUND

Germanium (Ge) and SiGe are materials having a higher carrier mobility than Si. Dopants are introduced into Ge and SiGe and are activated by various methods. The concentration of active dopant may be decreased during the manufacturing operations including various thermal processes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-6 show exemplary schematic views illustrating sequential manufacturing operations for an FET according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device/apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
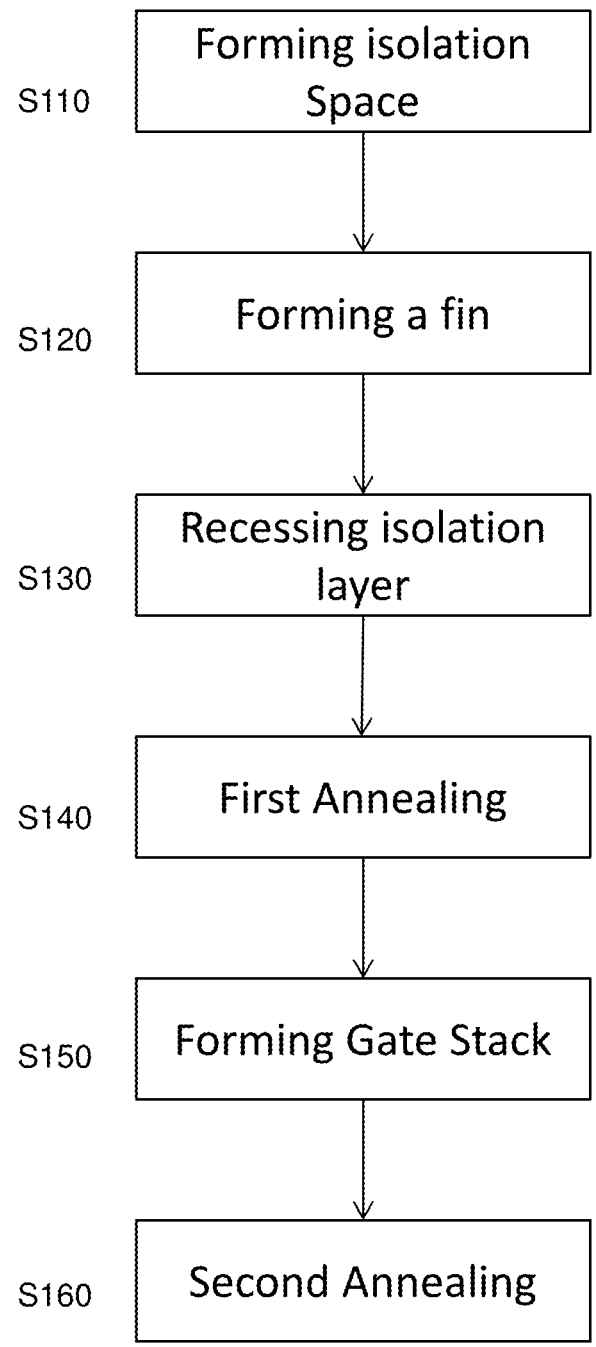
FIG. 1 shows an exemplary flow chart illustrating sequential manufacturing operations for an FET according to one embodiment of the present disclosure.
Figure 2A:
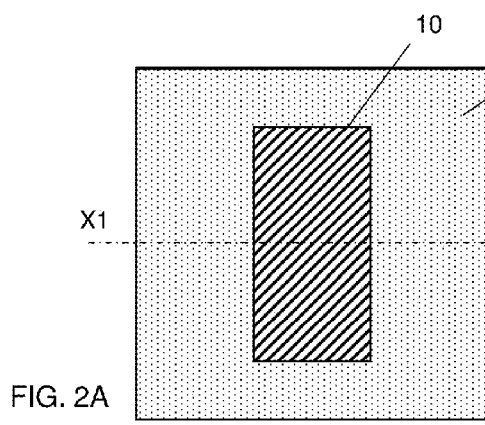

FIG. 1 shows an exemplary flow chart illustrating sequential manufacturing operations for an FET and FIGS. 2A-6 show exemplary schematic views illustrating sequential manufacturing operations for an FET according to one embodiment of the present disclosure. FIGS. 2A, 3A, 4A and 5A show exemplary plan views (top views), FIGS. 2B, 3B, 4B and 5B show exemplary cross sectional views along line X1-X1 of FIG. 2A or 5A, and FIG. 5C shows an exemplary cross sectional view along line Y1-Y1 of FIG. 5A. It is understood that additional operations can be provided before, during, and after the processes shown by FIGS. 1-6, and some of the operations described below can be replaced or eliminated, for additional embodiments of the method. The order of the operations/processes may be interchangeable.

Figure 2B:
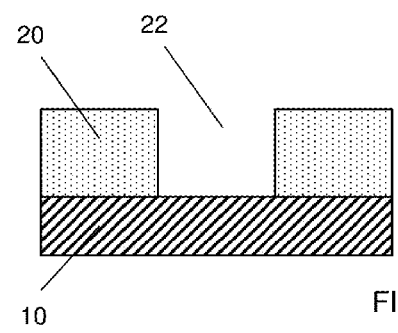

In S110 of FIG. 1, a space or opening 22 in an isolation insulating layer 20 is formed over a substrate 10, as shown in FIGS. 2A and 2B. The substrate is made of Si, $Si_{1-x}Ge_x$ (0<x<1) (hereinafter referred to as SiGe) or Ge. In one embodiment, a Si substrate is used. The isolation insulating layer 20 is made of one or more layers of insulating material, such as $SiO_2$, SiN or SiON. The isolation insulating layer 20 may be formed by thermal oxidation, chemical vapor deposition (CVD), atomic layer deposition (ALD), or physical vapor deposition including sputtering. At a bottom of the opening 22, the substrate 10 is exposed. The opening 22 may be formed by lithography and etching operations. The width of the opening is in a range from about 10 nm to about 100 nm in some embodiments.

Figure 3A:
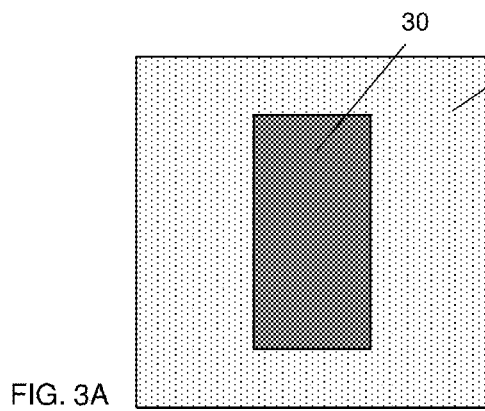
Figure 3B:
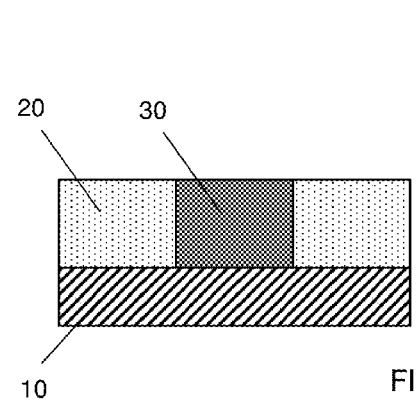

In S120 of FIG. 1, a fin structure 30 is formed in the opening 22, as shown in FIGS. 3A and 3B. The fin structure 30 is made of a first semiconductor material, such as Si, $Si_{1-x}Ge_x$ (0<x<1) and Ge. In certain embodiments, $Si_{1-x}Ge_x$, where 0.2<x≤1 is used as the first semiconductor material. The first semiconductor material is n-type doped with, for example, P, As and/or Sb. In one embodiment, n-type Ge is used as the first semiconductor material.

The first semiconductor material is epitaxially formed in the opening 22 by using CVD, ALD or molecular beam epitaxy (MBE). The substrate is heated at a temperature of about 300° C. to 400° C. for Ge epitaxial growth. The dopants may be introduced in the fin structure 30 during the epitaxial growth. In certain embodiments, other doping processes, such as ion implantation or solid-phase doping, is used. The chemical concentration of the dopants in the fin structure 30 is in a range from about $1.0\times10^{20}$ $cm^{-3}$ to about $5.0\times10^{20}$ $cm^{-3}$ in some embodiments.

The thickness of the fin structure 30 is in a range from about 50 nm to about 500 nm in some embodiments. In other embodiments, the fin structure 30 is in a range from about 100 nm to about 200 nm.

In some embodiments, the first semiconductor material is formed in the opening 22 to the same level as the surface of the isolation insulating layer 20. In other embodiments, the first semiconductor material is formed below or above the surface of the isolation insulating layer 20. If the first semiconductor material is formed above the surface of the isolation insulating layer 20, a planarization operation, such as chemical mechanical polishing, may be performed to remove the upper portion of the first semiconductor material.

Figure 4A:
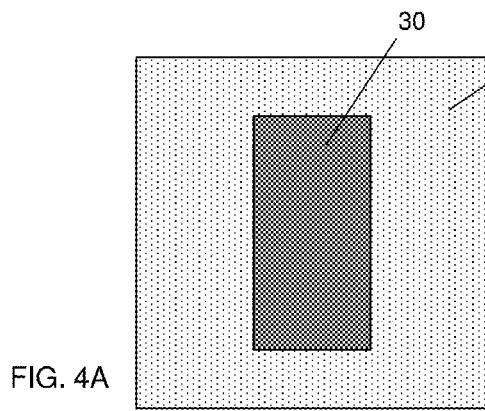
Figure 4B:
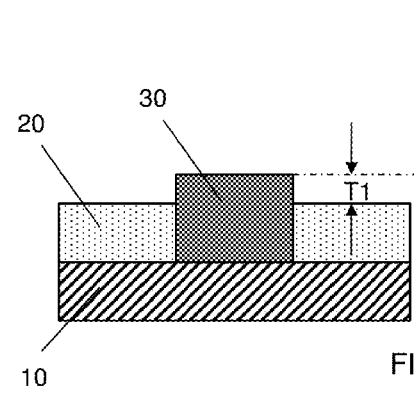

In S130 of FIG. 1, the isolation insulating layer 20 is recessed so that the upper portion of the fin structure 30 is exposed (protrudes) from the isolation insulating layer 20, as shown in FIGS. 4A and 4B. The isolation insulating layer 20 is recessed by using dry etching and/or wet etching. By the recess etching, the fin structure 30 protrudes from the isolation insulating layer 20 by a height T1 in a range from about 1 nm to about 200 nm in some embodiments. In other embodiments, T1 is in a range from about 10 nm to about 50 nm.

After the isolation insulating layer 20 is recessed, in step S140 of FIG. 1, a first annealing operation is performed. The first annealing operation includes a rapid thermal annealing (RTA) operation and/or a laser annealing operation. The first annealing operation of S140 is performed to improve crystallinity of the fin structure 30. When RTA is used, the substrate is heated at a temperature in a range from about 300° C. to about 850° C. for about 30 sec. to about 15 min. in some embodiments. In certain embodiments, the substrate is heated at a temperature in a range from about 800° C. to about 850° C. for about 8 min to 12 min. The conditions of the laser annealing will be described later.

In some embodiments, the first annealing operation of S140 is omitted. In other embodiments, the first annealing operation of S140 is performed before the recess etching of S130.

In S150 of FIG. 1, a gate stack 40 including a gate dielectric layer and a gate electrode layer (both not shown) is formed over a part of the fin structure 30, as shown in FIGS. 5A-5C.

The gate dielectric layer includes one or more layers of dielectric material, such as $SiO_2$, SiON, SiN, $HfO_2$, HfSiO, HfSiON, HfTaO, HfTiO, HfZrO, $ZrO_2$ or $Al_2O_3$. The gate dielectric layer may be formed by CVD, ALD or PVD. In some embodiments, a rapid thermal oxidation (RTO) at a temperature of about 300° C. to about 700° C. for about 1 min to about 5 min is performed after the dielectric layer is formed. In some embodiments, an interface dielectric layer (not shown) made of, for example silicon oxide and/or germanium oxide, is formed between the fin structure 30 and the gate dielectric layer, by the RTO.

The gate electrode layer includes one or more layers of conductive material, such as poly silicon, Al, Cu, W, Ti, Ta, TiN, TiAl, TiAlC, TiAlN, TaN, NiSi or CoSi. In some embodiments, one or more work function adjustment layers are interposed between the gate dielectric layer and the gate electrode layer. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. The gate electrode layer is formed with such a thickness and a material that the gate dielectric layer reflects at least 90% of the laser radiation in a laser annealing (S160) subsequent to the gate stack formation. In some embodiments, thickness of the gate electrode layer is in a range from about 10 nm to about 300 nm.

After blanket layers for the gate dielectric layer and the gate electrode layer are formed over the structure of FIGS. 4A and 4B, patterning operations including lithography and etching are performed to obtain a desired shape of the gate stack 40.

After the gate stack 40 is formed, in S160, a second annealing operation is performed. The second annealing operation includes a laser annealing operation 50 as shown in FIG. 6.

Figure 7A:
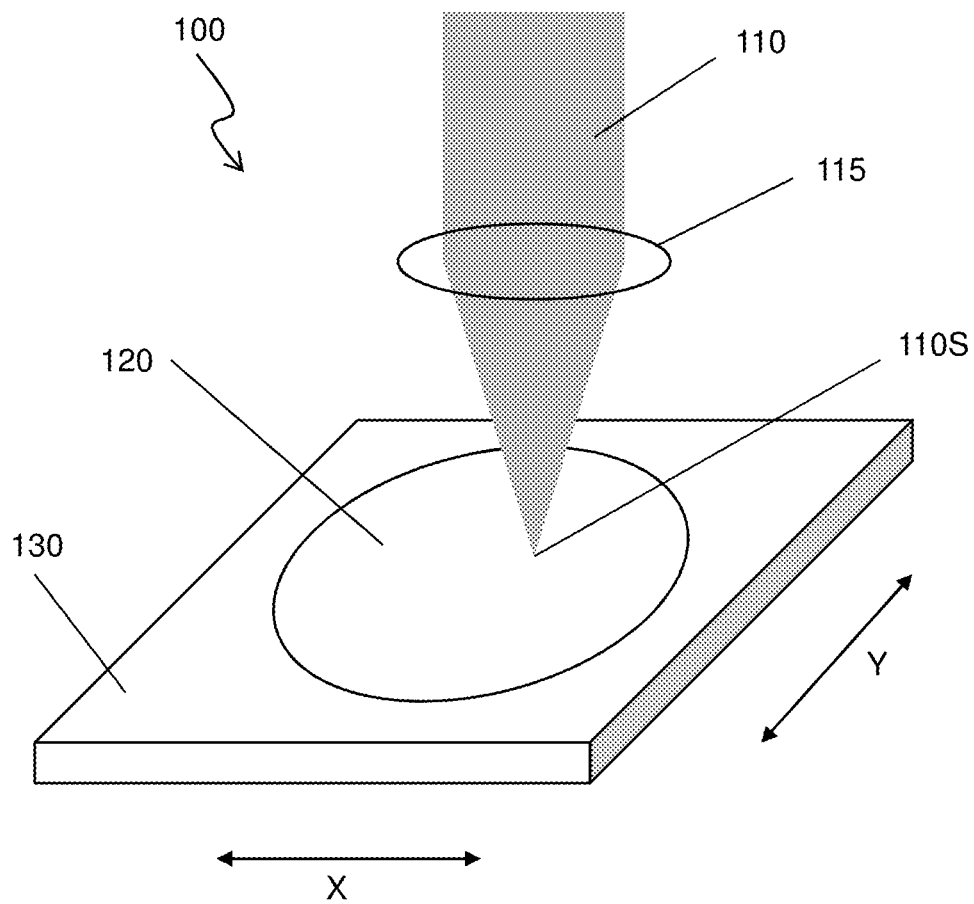
FIG. 7A shows an exemplary schematic view of a laser annealing apparatus.

FIG. 7A shows an exemplary schematic view of a laser annealing apparatus 100. A laser beam 110 emitted from a laser source (not shown) is directed to a substrate 120 (wafer) via an optical element 115 including, for example, one or more lenses and/or one or more mirrors. The substrate 120 is placed on a stage 130, which can move two dimensionally in the X and Y directions. By moving the stage, a spot 110S of the laser beam 110 scans the substrate. In some embodiments, the laser beam 110 is scanned by using a mirror, while the stage 130 is not moved or the stage 130 is also moved.

In some embodiments, a relative speed between the substrate 120 and a spot 110S of laser beam 110 is in a range from about 0.1 cm/s to about 100 cm/s. In other embodiments, the relative speed is in a range from about 1 cm/s to about 10 cm/s.

The wavelength of the laser beam 110 is equal to or greater than 193 nm and equal to or less than 1878 nm, which corresponds to the band gap of Ge. In some embodiments, the wavelength of the laser beam 110 is in a range from 193 nm to 1080 nm. The laser sources used in the laser annealing may include He—Ne laser (1152 nm, 994 nm, 543 nm), Ar ion laser (351-1092 nm), Nd:YAG laser (1064 nm), diode-pumped solid state (DPSS) green laser (532 nm), KrF laser (248 nm) and ArF laser (193 nm). Semiconductor lasers may also be used.

The power density of the laser beam 110 is in a range from about 0.1 $J/cm^2$ to about 0.9 $J/cm^2$ in some embodiments. In certain embodiments, the power density of the laser beam 110 is in a range from about 0.3 $J/cm^2$ to about 0.7 $J/cm^2$.

The laser beam 110 can be a pulse laser with a full-width-at half-maximum (FWHM) of about 0.1 nsec to about 1000 nsec in some embodiments. In other embodiments, the FWHM is in a range from about 1 nsec to about 50 nsec. The pulse repetition rate (frequency) is in a range from about 0.1 kHz to about 1 MHz in some embodiments. In certain embodiments, the pulse repetition rate (frequency) is in a range from about 1 kHz to about 100 kHz.

Figure 7B:
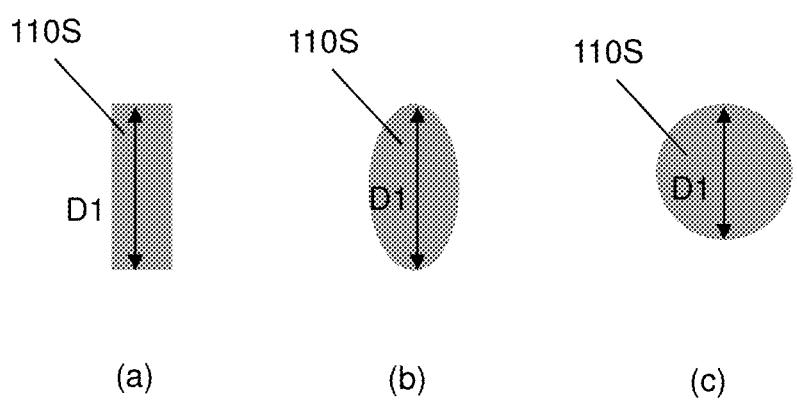
FIG. 7B shows exemplary shapes of laser spots.

FIG. 7B shows exemplary shapes of laser spot 110S. The shape of the laser spot 110S can be (a) a line, (b) an ellipse or (c) a circle as shown in FIG. 7B. The largest spot size D1 of the laser spot 110S is in a range from about 5 μm to about 500 μm in some embodiments. In certain embodiments, the spot size D1 is in a range from about 10 μm to about 100 μm.

Figure 8:
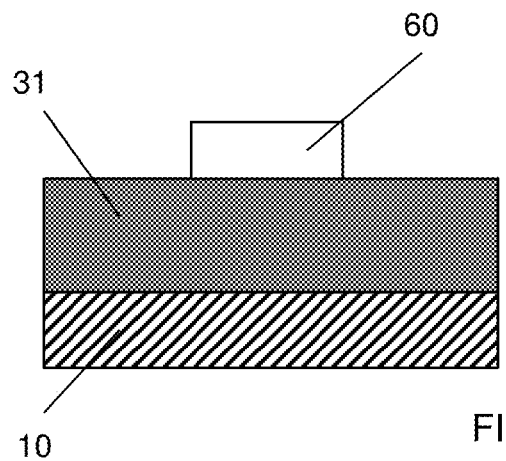
FIGS. 8-10 show exemplary cross sectional views illustrating sequential manufacturing operations for an FET according to one embodiment of the present disclosure.
Figure 9:
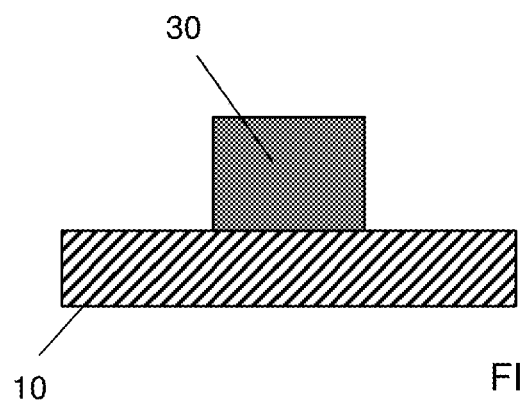
Figure 10:
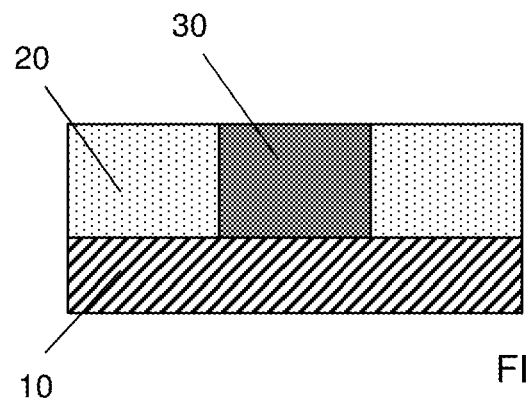

FIGS. 8-10 show exemplary cross sectional views illustrating sequential manufacturing operations for an FET according to one embodiment of the present disclosure. It is understood that additional operations can be provided before, during, and after processes shown by FIGS. 8-10, and some of the operations described below can be replaced or eliminated, for additional embodiments of the method. The order of the operations/processes may be interchangeable. The configurations, structures, materials, processes and/or operations similar to or the same as those described with FIGS. 1-6 may be employed in this embodiment and the detailed description thereof may be omitted.

FIGS. 8-10 show exemplary cross sectional views illustrating sequential manufacturing of a fin structure by an alternative method.

As shown in FIG. 8, a blanket layer of the first semiconductor layer 31 is epitaxially formed over the substrate 10. Then, a mask layer 60 is formed on the first semiconductor layer 31. The mask layer 60 includes, for example, a photo resist layer and/or one or more dielectric layers as a hard mask.

By using the mask layer 60 as an etching mask, the first semiconductor layer 31 is trench etched to form the fin structure 30 as shown in FIG. 9.

After the fin structure 30 is formed, the isolation insulating layer 20 is formed as shown in FIG. 10. Subsequently, the same or similar operations as explained with FIGS. 4A-6 are performed.

The effects and advantages of the second laser annealing operation will be explained.

Figure 11:
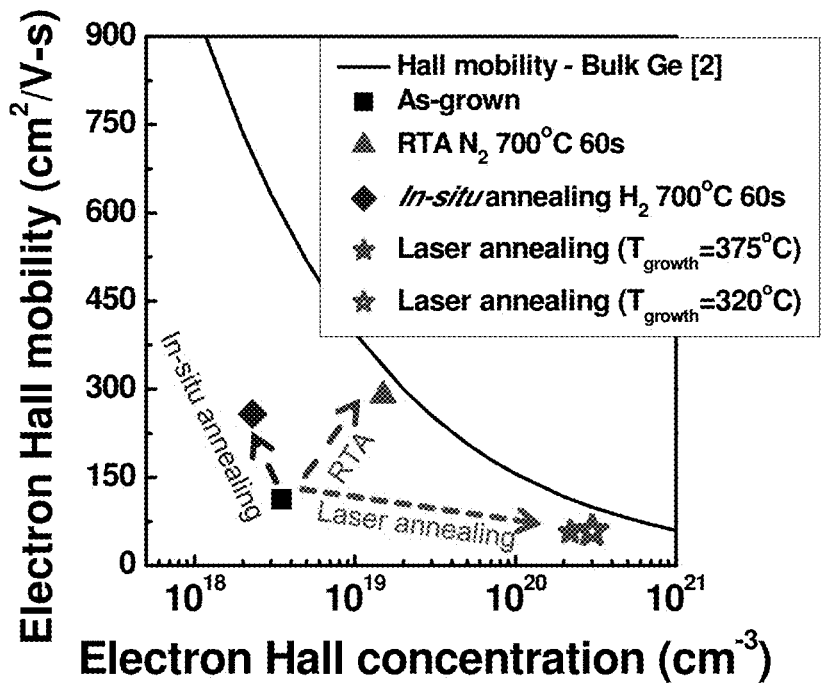
FIG. 11 shows the relationship between active dopant concentration and carrier mobility.
Figure 12:
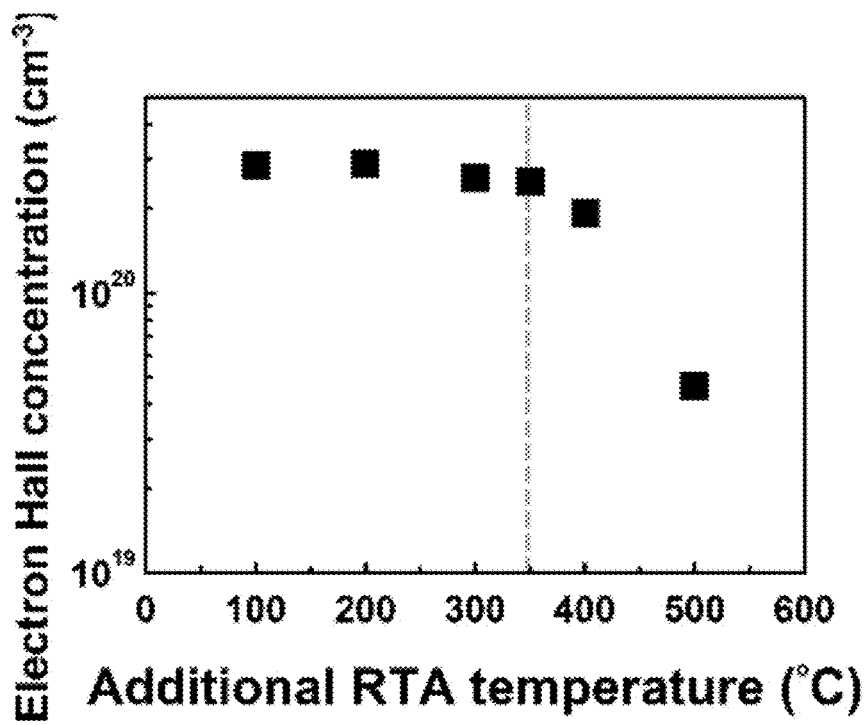
FIG. 12 shows the relationship between active dopant concentration and an annealing temperature.

FIG. 11 shows the relationships between active dopant concentration and carrier mobility of an as-grown Ge layer and a Ge layer treated by different annealing process. FIG. 12 shows the relationship between active dopant concentration in a Ge layer and an annealing temperature in additional heat treatment (e.g., RTA) after laser annealing. The horizontal axis shows an annealing temperature in an additional RTA process which may be performed in the manufacturing process of a Ge-based FET, and the vertical axis shows an electrically active dopant concentration in the n-type Ge layer.

After the Ge layer is epitaxially formed, the Ge layer (with the substrate) is subject to a different operation to activate the dopants. As shown in FIG. 11, when in-situ annealing at 700° C. for 60 sec in $H_2$ ambient is performed, the concentration of the electrically active dopants is about $2.5 \times 10^{18}$ $cm^{-3}$. Wen RTA at 700° C. for 60 sec in $N_2$ ambient is performed, the concentration of the electrically active dopants is about $1.7 \times 10^{19}$ $cm^{-3}$. The activated dopant concentrations of both operations are less than $1.0 \times 10^{20}$ $cm^{-3}$. In contrast, by using a laser annealing, an activated dopant concentration of more than $2.0 \times 10^{20}$ $cm^{-3}$ can be obtained as shown in FIG. 11. In FIG. 11, $T_{growth}$ means a temperature in the Ge layer growth process.

After the Ge layer is epitaxially formed and treated by laser annealing, the Ge layer (with the substrate) is subject to an RTA operation to study the deactivation of the dopants. As shown in FIG. 12, when the annealing temperature is equal to or less than 350° C., the concentration of the electrically active dopants is remained about $3.0 \times 10^{20}$ $cm^{-3}$. In other words, nearly 100% of the dopants remained activated. However, for an annealing temperature greater than 350° C., the active dopant concentration drops below $1.0 \times 10^{20}$ $cm^{-3}$.

Figure 13:
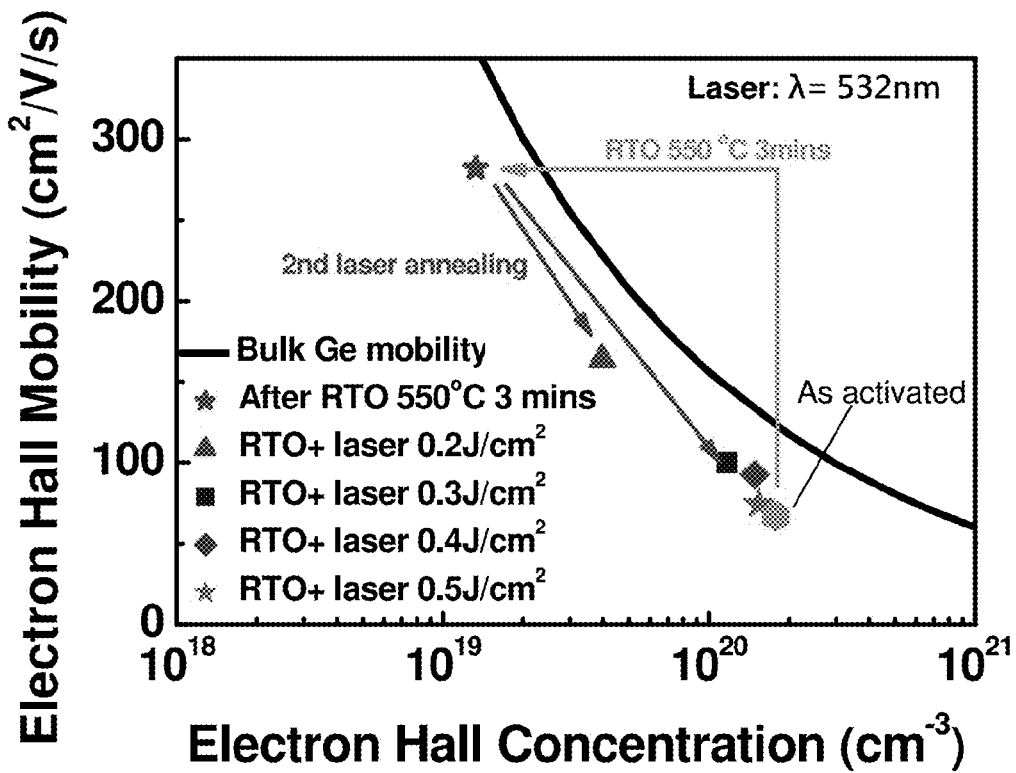
FIG. 13 shows the relationship between active dopant concentration and carrier mobility

As set forth above, after the Ge layer as a fin structure (channel and source/drain) is formed, there are one or more thermal processes (e.g., gate formation including RTO) which require a temperature equal to or more than 400° C. Once the Ge layer is subjected to an RTA having a temperature equal to or more than 400° C., some of the active dopants are deactivated. This is shown in FIGS. 12 and 13. The present inventors have found that the laser annealing can re-activate the dopant even though the dopants are deactivated by the thermal operations.

As shown in FIG. 13, the n-type Ge layer after the epitaxial growth is subjected to a first laser annealing to substantially fully activate the dopants (see, "As activated"). By the first laser annealing, the activated dopant concentration of about $2.0 \times 10^{20}$ $cm^{-3}$ was obtained.

Subsequently, the Ge layer is subjected to an RTO process at a temperature of 550° C. for 3 min. Due to the RTO process, the activated dopant concentration was decreased to about $1.2 \times 10^{19}$ $cm^{-3}$.

However, by applying a second laser annealing, the activated dopant concentration before the RTO was recovered (increased). In particular, for the laser power of 0.3-0.5 $J/cm^2$, the activated dopant concentration was increased to more than $1.0 \times 10^{20}$ $cm^{-3}$.

Figure 14:
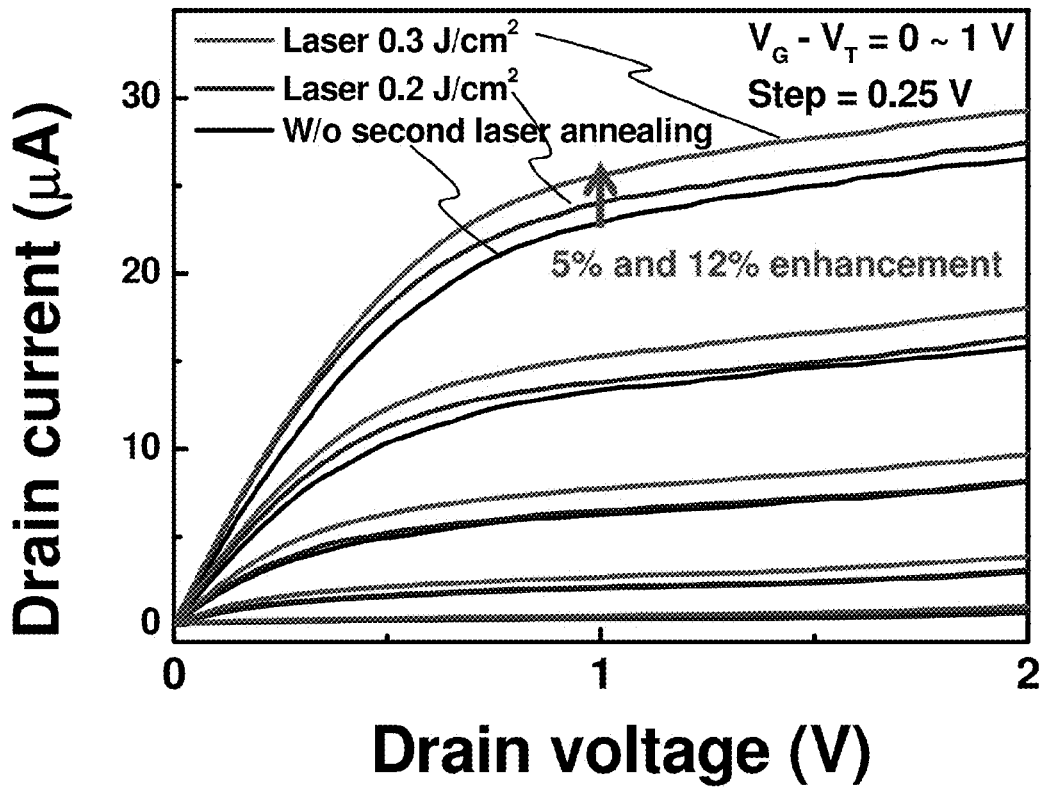
FIG. 14 shows $I_D$-$V_{GS}$ characteristics of FETs.

The effects of the second laser annealing are also observed from $I_D$-$V_{GS}$ characteristics of FETs. As shown in FIG. 14, the drain currents were increased by up to 12% by the use of the second laser annealing.

In the present embodiments, the second laser annealing is performed after the gate stack is formed, which requires thermal process exceeding 400° C. As shown in FIG. 6, the laser beam 50 is applied to the source and drain as well as the gate stack. However, since the gate electrode layer is formed of a material which can reflect more than 90% of the laser beam, the channel under the gate stack is not substantially annealed, while the source and drain are fully annealed.

Accordingly, the active dopant concentration of the source and drain is in a range from $1.0 \times 10^{20}$ $cm^{-3}$ to $5.0 \times 10^{20}$ $cm^{-3}$, while the active dopant concentration of the channel is lower than that of the source and drain, and is less than $1.0 \times 10^{20}$ $cm^{-3}$ in some embodiments. In certain embodiments, the active dopant concentration of the channel is in a range from about $1.0 \times 10^{18}$ $cm^{-3}$ to about $9.0 \times 10^{19}$ $cm^{-3}$. It is noted that the chemical concentration of the dopants is substantially the same between the source and drain and the channel. The source and drain may have a stripe-like or rough surface due to the laser annealing.

It is noted that after the second laser annealing, no heat treatment exceeding 400° C. should be performed. Alternatively, in some embodiments, the second laser annealing is performed after an epitaxial layer, which requires heating to temperatures exceeding 400° C. to form the source and the drain.

In certain embodiments, the laser annealing is replaced with flash annealing, dynamic surface annealing or other ultra-short-time and high-temperature annealing methods. In such ultra-short-time and high-temperature annealing methods, including laser annealing, the Ge layer (at the source and drain) is locally heated close to or more than its melting point for about less than about 1 sec.

When the fin structure 30 is made of SiGe, a higher amount of heat is applied by the laser annealing (e.g., higher power, higher pulse frequency and/or lower scanning speed) than the case of the Ge fin structure.

Further, a gate replacement process may be employed. In addition, the present methods may be applied to gate-all-around (GAA) type FETs.

In the present embodiments, laser annealing is performed on n-type Ge (or SiGe) fin structures after the gate stack is formed. By using laser annealing, the deactivated dopants, which have been deactivated by one or more thermal processes during the gate formation, can be re-activated. Accordingly, it is possible to obtain a higher concentration of the electrically activated dopants in the n-type Ge layer, such as greater than $1.0 \times 10^{20}$ $cm^{-3}$.

It will be understood that not all advantages have been necessarily discussed herein, no particular advantage is required for all embodiments or examples, and other embodiments or examples may offer different advantages.

According to one aspect of the present disclosure, in a method of fabricating a field effect transistor, a fin structure made of a first semiconductor material is formed. The fin structure protrudes from an isolation insulating layer disposed over a substrate. A gate structure is formed over a part of the fin structure, thereby defining a channel region, a source region and a drain region in the fin structure. After the gate structure is formed, laser annealing is performed on the fin structure.

According to another aspect of the present disclosure, in a method of fabricating a field effect transistor, a fin structure made of a first semiconductor material is formed. The fin structure protrudes from an isolation insulating layer disposed over a substrate. A first annealing is performed on the fin structure. A gate structure is formed over a part of the fin structure, thereby defining a channel region, a source region and a drain region in the fin structure. After the gate structure is formed, a second annealing is performed on the fin structure. The first semiconductor material is n-type Ge, and the second annealing is laser annealing.

In accordance with yet another aspect of the present disclosure, a semiconductor device includes a field effect transistor, comprises a fin structure made of n-type Ge and having a channel, a source and a drain; and a gate stack including a gate dielectric and a gate electrode and disposed over a part of the fin structure. The gate dielectric is formed at a temperature exceeding 400° C. A concentration of electrically active dopants in the source and the drain is in a range from $1.0 \times 10^{20}$ cm$^{-3}$ to $1.0 \times 10^{21}$ cm$^{-3}$.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a field effect transistor, comprising:
   forming a fin structure made of a first semiconductor material, the fin structure including source and drain regions having dopants and protruding from an isolation insulating layer disposed over a substrate;
   after forming the fin structure including the source and drain regions having the dopants, forming a gate structure over a part of the fin structure, thereby defining a channel region between the source and drain regions having the dopants in the fin structure; and
   after the gate structure is formed, performing laser annealing on the fin structure, thereby activating the dopants in the source and drain regions,
   wherein the field effect transistor includes the gate structure, and the source and drain regions, and
   upper surfaces of the entire source region and the entire drain region of the field effect transistor are coplanar with an upper surface of the fin structure.

2. The method of claim 1, wherein the first semiconductor material is $Si_{1-x}Ge_x$, where $0.2 < x \leq 1$.

3. The method of claim 1, wherein the first semiconductor material is n-type Ge.

4. The method of claim 3, wherein a wavelength of laser in the laser annealing is in a range from 193 nm to 1878 nm.

5. The method of claim 3, wherein a power density of a laser in the laser annealing is in a range from 0.1 J/cm$^2$ to 0.9 J/cm$^2$.

6. The method of claim 3, wherein a relative speed between the substrate and a spot of a laser in the laser annealing is in a range from 0.1 cm/s to 100 cm/s.

7. The method of claim 3, wherein a laser in the laser annealing is a pulse laser with a full-width-at half-maximum of pulses being 0.1 nsec to 1000 nsec.

8. The method of claim 3, wherein after the laser annealing, a concentration of electrically active dopants in the source region and the drain region is in a range from $1.0 \times 10^{20}$ cm$^{-3}$ to $5 \times 10^{20}$ cm$^{-3}$.

9. The method of claim 3, wherein the gate stack includes a gate electrode made of a material that reflects more than 90% of laser radiation during in the laser annealing.

10. The method of claim 3, wherein after the laser annealing, no heat treatment exceeding 400° C. is performed.

11. The method of claim 3, wherein the laser annealing is performed after an epitaxial layer for the source and the drain is formed.

12. A method of fabricating a field effect transistor, comprising:
    forming a fin structure made of a first semiconductor material, the fin structure including source and drain regions having dopants and protruding from an isolation insulating layer disposed over a substrate;
    after forming the fin structure including the source and drain regions having the dopants, performing a first annealing on the fin structure;
    after the first annealing is performed, forming a gate structure over a part of the fin structure, thereby defining a channel region between the source region and the drain region in the fin structure; and
    after the gate structure is formed, performing a second annealing on the fin structure, thereby activating the dopants in the source region and the drain region, wherein:
    the first semiconductor material is n-type Ge,
    the second annealing is laser annealing, and
    the field effect transistor includes the gate structure, and the source and drain regions, and
    upper surfaces of the entire source region and the entire drain region of the field effect transistor are coplanar with an upper surface of the fin structure.

13. The method of claim 12, wherein the n-type Ge is doped with at least one of P, As, or Sb.

14. The method of claim 12, wherein:
    the substrate is Si, and
    the n-type Ge is epitaxially formed on the substrate.

15. The method of claim 12, wherein the forming the fin structure includes:
    forming the isolation insulating layer over the substrate;
    patterning the isolation insulating layer, thereby forming an opening, the substrate being exposed at a bottom of the opening;
    forming the first semiconductor material on the exposed substrate in the opening; and
    recessing the isolation insulating layer so that the fin structure made of the first semiconductor material protrudes from the isolation insulating layer.

16. The method of claim 15, wherein the first annealing is performed before recessing the isolation insulating layer.

17. The method of claim 12, wherein the forming the fin structure includes:

forming an epitaxial layer made of the first semiconductor material on the substrate;

patterning the epitaxial layer into the fin structure;

forming the isolation insulating layer so that the fin structure is embedded in the isolation insulating layer; and recessing the isolation insulating layer so that the fin structure made of the first semiconductor material protrudes from the isolation insulating layer.

18. The method of claim 17, wherein the first annealing is performed before recessing the isolation insulating layer.

19. A method of fabricating a field effect transistor, comprising:

forming a fin structure made of $Si_{1-x}Ge_x$, where $0.2<x\leq1$, the fin structure having source and drains having dopants and protruding from an isolation insulating layer disposed over a substrate;

after forming the fin structure including the source and drain regions having the dopants, performing a first annealing on the fin structure at a temperature of 300° C. to 850° C.;

after the first annealing is performed, forming a gate structure over a part of the fin structure, thereby defining a channel region between the source region and the drain region in the fin structure; and after the gate structure is formed, performing a second annealing on the fin structure, thereby activating the dopants in the source and drain regions, wherein:

the second annealing is laser annealing, the $Si_{1-x}Ge_x$ is doped with at least one of P, As, or Sb, after the second annealing, a concentration of electrically active dopants in the source and the drain is in a range from $1.0\times10^{20}$ cm$^{-3}$ to $5.0\times10^{20}$ cm$^{-3}$, and a concentration of electrically active dopants in the channel region is $1.0\times10^{18}$ cm$^{-3}$ to $9.0\times10^{19}$ cm$^{-3}$, the field effect transistor includes the gate structure, and the source and drain regions, and upper surfaces of the entire source region and the entire drain region of the field effect transistor are coplanar with an upper surface of the fin structure.

20. The method of claim 19, wherein the laser annealing is performed by using at least one selected the group consisting of He-Ne laser, Ar ion laser, Nd:YAG laser, diode-pumped solid state green laser, KrF laser and ArF laser.

\* \* \* \* \*

UNITED STATES PATENT AND TRADEMARK OFFICE
CERTIFICATE OF CORRECTION

PATENT NO. : 10,068,995 B2
APPLICATION NO. : 15/210388
DATED : September 4, 2018
INVENTOR(S) : Lu et al.

Page 1 of 1

It is certified that error appears in the above-identified patent and that said Letters Patent is hereby corrected as shown below:

On the Title Page

(73) Assignee, please insert:
--TAIWAN SEMICONDUCTOR MANUFACTURING CO., LTD.
(HSINCHU, TAIWAN)
NATIONAL TAIWAN UNIVERSITY (TAIPEI, TAIWAN)--

Signed and Sealed this
Eighteenth Day of June, 2019

Andrei Iancu
*Director of the United States Patent and Trademark Office*